(12) United States Patent
Luo (10) Patent No.: US 10,727,196 B2
(45) Date of Patent: Jul. 28, 2020

(54) CHIP PACKAGING STRUCTURE AND PACKAGING METHOD

(71) Applicant: SHENZHEN GOODIX TECHNOLOGY CO., LTD., Guangdong (CN)

(72) Inventor: Junping Luo, Guangdong (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 21 days.

(21) Appl. No.: 16/170,847

(22) Filed: Oct. 25, 2018

(65) Prior Publication Data

US 2019/0067236 A1 Feb. 28, 2019

Related U.S. Application Data

(63) Continuation of application No. PCT/CN2017/072710, filed on Jan. 25, 2017.

(51) Int. Cl.
*H01L 23/52* (2006.01)
*H01L 23/00* (2006.01)
*H01L 23/31* (2006.01)
*H01L 21/56* (2006.01)
*G06K 9/00* (2006.01)
(Continued)

(52) U.S. Cl.
CPC .......... *H01L 24/32* (2013.01); *G06K 9/00006* (2013.01); *G06K 9/00053* (2013.01); *H01L 21/56* (2013.01); *H01L 23/3135* (2013.01); *H01L 23/562* (2013.01); *H01L 21/304* (2013.01); *H01L 23/293* (2013.01); *H01L 23/3107* (2013.01); *H01L 23/3121* (2013.01);
(Continued)

(58) Field of Classification Search
CPC ........ H01L 21/56; H01L 23/562; H01L 24/32
USPC ........................................................ 257/783
See application file for complete search history.

(56) References Cited

U.S. PATENT DOCUMENTS

2005/0037537 A1* 2/2005 Kim .................... H01L 21/6836
438/106
2005/0095812 A1 5/2005 Derderian et al.
(Continued)

FOREIGN PATENT DOCUMENTS

CN 102522383 A 6/2012
CN 102543931 A 7/2012
(Continued)

OTHER PUBLICATIONS

Extended European Search Report for European Application No. 17894547.3 dated May 2, 2019.

*Primary Examiner* — Luan C Thai
(74) *Attorney, Agent, or Firm* — Heslin Rothenberg Farley & Mesiti P.C.

(57) ABSTRACT

A chip packaging structure comprises a die, a carrier, a die attach film, and a plastic package body. The die attach film is disposed on the bottom surface of the die, with a thickness of the die attach film being greater than or equal to 40 micrometers. The die is disposed on the carrier via the die attach film; and the plastic package body is disposed on the carrier and coats a top surface and side surfaces of the die, whereby the overall impact resistance of a chip is improved without changing the structure of the carrier, the expense for making a mold is saved, and moreover, the packaging structure is simple and easy for mass production.

18 Claims, 6 Drawing Sheets

(51) Int. Cl.
*H01L 23/29* (2006.01)
*H01L 21/304* (2006.01)

(52) U.S. Cl.
CPC .......................... *H01L 2224/3201* (2013.01); *H01L 2924/181* (2013.01)

(56) References Cited

U.S. PATENT DOCUMENTS

2010/0233409 A1* 9/2010 Kamiya ............. C08G 18/6229
428/41.5
2012/0153508 A1* 6/2012 Hayashi ................ C09J 133/08
257/783
2013/0228901 A1 9/2013 Dershem et al.

FOREIGN PATENT DOCUMENTS

CN 105097722 A 11/2015
CN 106158780 A 11/2016

* cited by examiner

CHIP PACKAGING STRUCTURE AND PACKAGING METHOD

CROSS REFERENCE TO RELATED APPLICATIONS

This disclosure is a continuation of international application number PCT/CN2017/072710, filed on Jan. 25, 2017, which application is hereby incorporated by reference herein, in its entirety.

TECHNICAL FIELD

Embodiments of the present disclosure relate to the packaging technologies, in particular to a chip packaging structure and a chip packaging method.

BACKGROUND

A fingerprint module is an important exterior component of an electronic device such as a mobile phone, a tablet computer and the like. Consumers have higher and higher requirements on its structural strength, i.e. the fingerprint module is required to bear certain external force of static pressure and the impact damage action of an external object. In practice, strength of a fingerprint sensor is tested by slowly applying external force onto the fingerprint module through a spherical pressure head, or by dropping a steel ball from a certain height onto the fingerprint module.

In the process of making an invention of the present disclosure, the inventor(s) found that there are at least the following problems in the existing technologies: existing fingerprint sensors are still difficult to meet the high-strength requirements. They can easily fail in function, and even worse, the chip cracks, under the external force of static pressure and the impact action of an external object.

SUMMARY

Some embodiments of the present disclosure provide a chip packaging structure and packaging method, which can improve the overall impact resistance of a chip without changing the structure of a carrier, and save the expense for making a mold; and the packaging structure is simple and easy for mass production.

In order to solve the foregoing technical problems, some embodiments of the present disclosure provide a chip packaging structure and packaging method. The chip packaging structure includes a die, a carrier, a die attach film and a plastic package body; the die attach film is disposed on a bottom surface of the die, and a thickness of the die attach film is greater than or equal to 40 micrometers; the die is disposed on the carrier via the die attach film; the plastic package body is disposed on the carrier and covers a top surface and a plurality of side surfaces of the die.

Some embodiments of the present disclosure further provide a chip packaging method, including: disposing a die attach film on a bottom surface of at least one die, wherein a thickness of the die attach film is greater than or equal to 40 micrometers; disposing the die onto a carrier via the die attach film; packaging the die by utilizing a plastic package body, wherein the plastic package body is disposed on the carrier and covers a top surface and a plurality of side surfaces of the die, to form a chip packaging structure.

Compared with the existing technologies, some embodiments of the present disclosure can improve the overall impact resistance of the chip, i.e., improve the strength of the chip, by increasing the thickness of the die attach film. Moreover, there is no need to change the structure of the carrier, the expense for making a mold is saved; besides, the packaging structure is simple, and the mass production is easy to realize.

Furthermore, the thickness of the die attach film is smaller than or equal to 150 micrometers. If the thickness of the die attach film is excessively large, the chip is likely to incline when the chip is wired, which increases production difficulty, and decreases packaging yield. Therefore, in the present embodiment, by limiting an upper limit value of the thickness of the die attach film, not only can the strength of the chip be ensured, but also the production difficulty can be reduced, and the packaging yield is improved.

Furthermore, a total thickness of the die and the die attach film is equal to a first preset value. That is, a total thickness of the chip packaging structure is kept constant, which may avoid an influence of an increased total thickness of the chip packaging structure on a design or manufacturing of an electronic device using the chip packaging structure.

Furthermore, the chip packaging structure further includes a protection layer; and the protection layer is disposed on the top surface of the die and coated by the plastic package body. The protection layer can protect the die well, and help to better resist the external impact damage, thereby further improving the overall strength.

Furthermore, a total thickness of a portion of the plastic package body covering the protection layer and the protection layer is equal to a second preset value. Therefore, a total height of the protection layer and the plastic package body above the protection layer is constant, so that the performance of the chip is not influenced, and the total packaging thickness is constant.

Furthermore, the bottom surface of the die is a smooth surface. Therefore, scratches can be effectively reduced, i.e. a crack source is reduced (a crack is likely to occur at the scratches when the chip is under the external pressure), thereby improving the strength of the chip.

BRIEF DESCRIPTION OF THE DRAWINGS

One or more embodiments are exemplarily illustrated through drawings in accompanying drawings corresponding thereto, but the exemplary description does not limit the embodiments; and like reference numerals in the drawings represent similar elements; unless otherwise specifically specified, the drawings do not represent the proportion limit.

DETAILED DESCRIPTION

In order to make the purposes, technical solutions and advantages of the present disclosure clearer, various embodiments of the present disclosure are further described below in detail in combination with the drawings. However, the ordinary skilled in the prior art can understand that a lot of technical details are proposed to make the present disclosure better understood by a reader in the embodiments of the present disclosure. However, the technical solutions claimed in the present disclosure can also be implemented without these technical details and various changes and modifications based on the embodiments.

Figure 1:
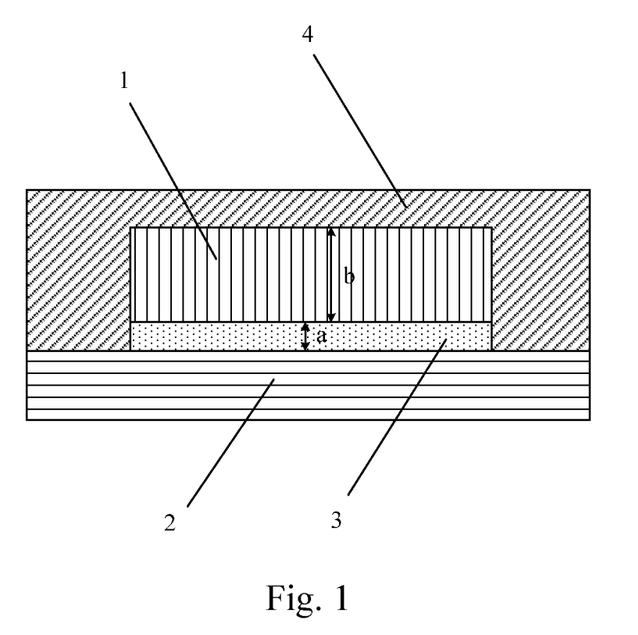
FIG. 1 is a schematic diagram illustrating a chip packaging structure according to a first embodiment of the present disclosure.

A first embodiment of the present disclosure relates to a chip packaging structure, as shown in FIG. 1, including: a die 1, a carrier 2, a die attach film 3 and a plastic package body 4.

Specifically, in the present embodiment, the die attach film 3 is disposed on a bottom surface of the die 1, and a thickness of the die attach film 3 is greater than or equal to 40 micrometers. The die 1 is disposed on the carrier 2 via the die attach film 3. The plastic package body 4 is disposed on the carrier 2 and covers a top surface and a plurality of side surfaces of the die 1.

Two surfaces of the die attach film 3 can be respectively provided with adhesive, one surface of the die attach film 3 is bonded onto the carrier 2, and the other surface is bonded onto the bottom surface of the die 1, so that the die 1 is disposed on the carrier 2. In actual practices, when an external object impacts the die 1, a circuit layer of the die 1 is easily damaged, even worse, the whole die 1 cracks, thus in the present embodiment, the die attach film 3 can be a soft material, which can have a good buffering effect on the die 1 once the external object impacts the die 1. Moreover, the overall impact resistance, i.e., the strength of the die 1, can be improved by increasing the thickness of the die attach film 3.

Compared with the existing art, the present embodiment can improve the overall impact resistance, i.e., the strength of the die 1 by increasing the thickness of the die attach film 3. Moreover, there is no need to change the structure of the carrier 2, which saves the expense for making a mold; besides, the packaging structure is simple and the mass production is easy to realize.

A second embodiment of the present disclosure relates to a chip packaging structure. The second embodiment is improved on the basis of the first embodiment, wherein the improvement lies in that: the present embodiment provides a preferable implementation manner of the die attach film 3 and the carrier 2, referring to FIG. 1.

Specifically, in the present embodiment, the thickness of the die attach film 3 is greater than or equal to 40 micrometers, so that the strength of the die 1 can be improved by increasing the thickness of the die attach film 3. However, if the thickness of the die attach film 3 is excessively large, the die 1 is likely to incline when the die 1 is wired bonded, which increases the production difficulty and decreases the packaging yield. Preferably the thickness of the die attach film 3 is smaller than or equal to 150 micrometers, i.e. the thickness of the die attach film 3 is controlled within a range from 40 micrometers to 150 micrometers, not only can the strength of the die 1 be ensured, but also the production difficulty can be reduced, and the packaging yield can be increased.

Preferably, a total thickness of the die 1 and the die attach film 3 is equal to a first preset value (as shown in FIG. 1, the thickness of the die attach film 3 is and the thickness of the die 1 is b, the sum of a and b is equal to the first preset value. The first preset value in the present embodiment may be set according to the actual requirement. For example, the first preset value may be a height of the die and the die attach film in the existing art. In other words, if the thickness of the die attach film 3 is relatively large, the thickness b of the die 1 can be correspondingly reduced, so that the total thickness of the chip packaging structure can be constant, thereby avoiding the effect of the increased total thickness of the chip packaging structure on the design or manufacturing of an electronic device using the chip packaging structure.

In the present embodiment, the carrier 2 may be a substrate. Of course, the carrier 2 may be a lead frame. This is not limited in the present embodiment.

The present embodiment provides a preferable implementation manner of the die attach film 3 and the carrier 2. By limiting the upper limit value of the thickness of the die attach film 3, not only can ensure the strength of the die 1, but also can reduce the production difficulty, thereby improving the packaging yield. Moreover, since the total thickness of the chip packaging structure is constant, the effect of the increased total thickness of the chip packaging structure on the design or manufacturing of an electronic device using the chip packaging structure is avoided.

A third embodiment of the present disclosure relates to a chip packaging structure. The third embodiment is improved on the basis of the first embodiment, wherein the improvement lies in that: in the present embodiment, the chip packaging structure further includes a protection layer 5, as shown in FIG. 2.

Specifically, in the present embodiment, the protection layer 5 may be disposed on the top surface of the die 1 and coated by the plastic package body 4. Preferably, the protection layer 5 may be of a polyimide material, so that the die 1 can be well protected, and the external impact damage can be better resisted, thereby improving the overall strength.

Figure 2:
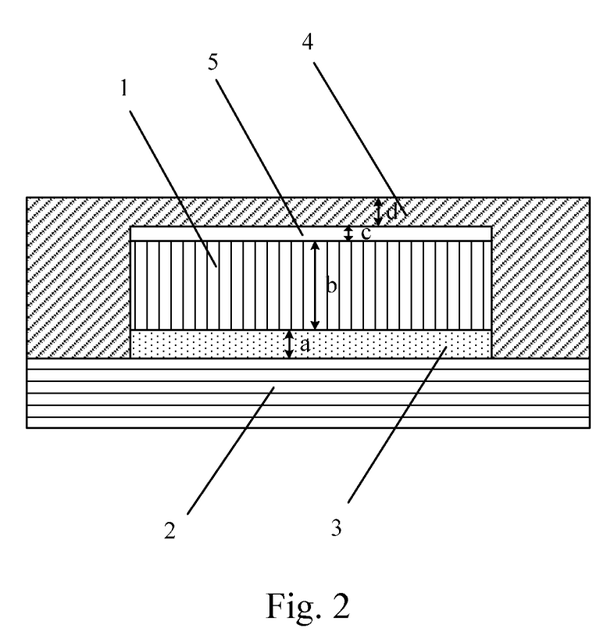
FIG. 2 is a schematic diagram illustrating the chip packaging structure according to a third embodiment of the present disclosure.

The total thickness of a portion of the plastic package body 4 covering the protection layer 5 and the protection layer 5 is equal to a second preset value (as shown in FIG. 2, the thickness of the protection layer 5 is c, and the thickness of the portion of the plastic package body 4 covering the protection layer 5 is d, the sum of c and d is equal to the second preset value). Specifically, the second preset value may be set according to the actual requirement. For example, the second preset value may be a height of a portion of the plastic package body corresponding to the top surface of the die in the chip packaging structure of the existing art. In the present embodiment, the thickness c of the protection layer 5 may be greater than or equal to 1 micrometer, and less than or equal to 20 micrometers. If the thickness c of the protection layer 5 is relative large, the thickness d of the plastic package body 4 above the protection layer 5 can be appropriately reduced, so that the sum of the thickness of the protection layer and the thickness of the plastic package body 4 above the protection layer 5 is equal to the second preset value, i.e. the thickness sum of the protection layer 5 and the plastic package body 4 above the protection layer 5 may be constant, so that the performance of the die 1 is not influenced.

In the present embodiment, the die 1 can be well protected by the protection layer 5 and can better resist the external impact damage, thereby improving the overall strength. By limiting the total thickness of the portion of the plastic package body 4 covering the protection layer 5 and the protection layer 5, a total height of the protection layer 5 and the plastic package body 4 above the protection layer 5 is constant, so that the performance of the chip is not influenced, and the total packaging thickness is constant.

A fourth embodiment of the present disclosure relates to a chip packaging structure. The fourth embodiment is improved on the basis of the first embodiment, wherein the improvement lies in that: in the present embodiment, the bottom surface of the die 1 is a smooth surface, referring to FIG. 1.

Specifically, the die 1 is ground into a specific thickness during the chip packaging process, which may results in a lot of scratches at the bottom of the die 1, and the scratches are generally the origin of cracks of the die 1. That is, the die 1 is easy to crack when the die 1 is under the external static pressure. Therefore, it may polish the bottom of the die 1 to form a smooth surface, so that the scratches can be effectively decreased, i.e. the crack source is decreased, thereby improving the strength of the die 1.

The present embodiment can effectively decrease the scratches, i.e. the crack source (cracks are likely to occur at the scratches when the die is under the external pressure), thereby improving the strength of the die 1.

A fifth embodiment of the present disclosure relates to a chip packaging structure. The fifth embodiment is improved on the basis of the first embodiment, wherein the improvement lies in that: in the present embodiment, the substrate and the die attach film 3 may be made of a high-modulus material, referring to FIG. 1.

Specifically, in the present embodiment, the modulus of the substrate may be greater than 20 GPa, and the modulus of the die attach film 3 may be greater than 4 MPa, so that under certain stress effect, the elastic deformation of the substrate and the die attach film 3 can be greatly reduced, i.e. the rigidity of the substrate and the die attach film 3 can be improved.

The present embodiment provides a preferable implementation manner of the substrate and the die attach film 3, so that the rigidity of the substrate and the die attach film 3 can be improved.

Figure 3:
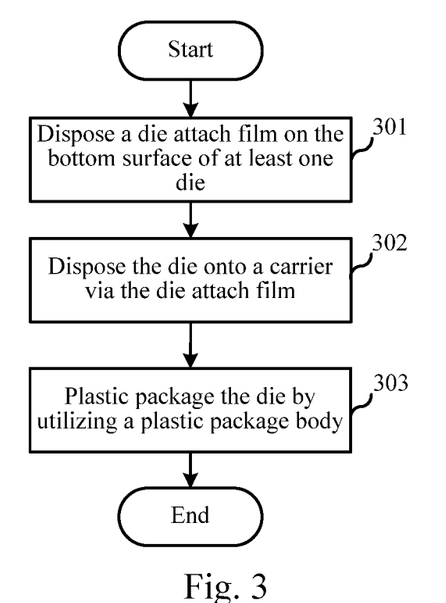
FIG. 3 is a flow chart illustrating a chip packaging method according to a sixth embodiment of the present disclosure.

A sixth embodiment of the present disclosure relates to a chip packaging method. The process of the chip packaging method is as shown in FIG. 3, which is specifically as follows:

In step 301, a die attach film is disposed on a bottom surface of at least one die. Specifically, a thickness of the die attach film in the present embodiment is greater than or equal to 40 micrometers, and two surfaces of the die attach film are respectively provided with adhesive.

In step 302, the die is disposed on a carrier via the die attach film. Specifically, one surface of the die attach film is bonded onto the carrier, and the other surface is bonded onto the bottom surface of the die, so that the die can be disposed on the carrier.

In step 303, the die is plastic packaged by utilizing a plastic package body. The plastic package body is disposed on the carrier and coats a top surface and a plurality of side surfaces of the die to form a chip packaging structure.

A plurality of dies to be packaged are generally connected together to form an interconnected die. The die attach film can be bonded onto the bottom surface of the interconnected die, then the interconnected die is cut into single dies (at this time, the bottom surface of each single die is provided with the adhesive layer), and the single die is the die of the present disclosure. Then, the plurality of single dies are disposed on the carrier (a substrate or a lead frame), and the plurality of single dies are packaged by an injection molding method. Finally the packaged chip is cut to obtain a single chip packaging structure, and the single chip packaging structure is the chip packaging structure of the present disclosure.

Compared with the existing art, the present embodiment can improve the overall impact resistance, i.e., the strength of the die by increasing the thickness of the die attach film. Moreover, there is no need to change the structure of the carrier, which saves the expense for making a mold; besides, the packaging structure is simple and the mass production is easy to realize.

It is not difficult to find that the present embodiment is a method embodiment corresponding to the first embodiment, and the present embodiment can be implemented cooperatively with the first embodiment. The relevant technical details mentioned in the first embodiment are valid in the present embodiment, and in order to reduce duplication, the details are not described herein. Correspondingly, the relevant technical details mentioned in the present embodiment may also be applied to the first embodiment.

Figure 4:
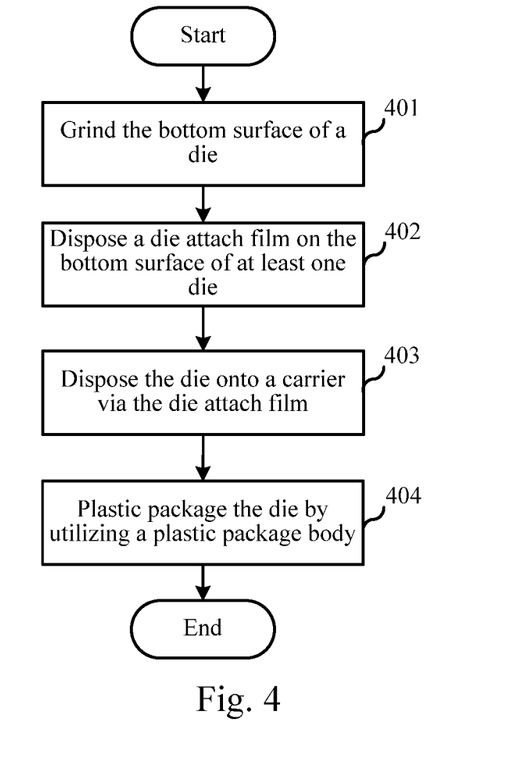
FIG. 4 is a flow chart illustrating a chip packaging method according to a seventh embodiment of the present disclosure.

A seventh embodiment of the present disclosure relates to a chip packaging method. The seventh embodiment is improved on the basis of the sixth embodiment. The improvement lies in that: in the present embodiment, the bottom surface of the die may be ground before the die attach film is disposed on the bottom surface of the die, and the process of the chip packaging method of the present embodiment is as shown in FIG. 4, which is specifically as follows:

In step 401, the bottom surface of the die is ground, wherein a total thickness of the ground die and the die attach film is equal to a first preset value. Specifically, the bottom surface of the die may be ground to reduce the height of the die. In the present embodiment, the die may be firstly ground to the height in the existing art and then continuously ground to the height of the present solution, so that the total thickness of the ground die and the die attach film is equal to the first preset value. The first preset value of the present embodiment can be set according to the actual requirement. For example, the first preset value may be a height value of the die and the die attach film in the existing art, that is to say, if the thickness of the die attach film is relative large, the thickness of the die can be correspondingly decreased, so that the total thickness of the chip packaging structure can be constant, thereby avoiding an influence of the increased total thickness of the chip packaging structure on the design or manufacturing of an electronic device using the chip packaging structure.

In step 402, the die attach film is disposed on the bottom surface of at least one die. Specifically, two surfaces of the die attach film in the present embodiment are respectively provided with the adhesive, the thickness of the die attach film is greater than or equal to 40 micrometers, and less than or equal to 150 micrometers, and the modulus of the die attach film may be greater than 4 MPa.

In step 403, the die is disposed on the carrier via the die attach film. Specifically, the carrier in the present embodiment may be a substrate, and the modulus of the substrate may be greater than 20 GPa. One surface of the die attach film may be bonded onto the carrier, and the other surface may be bonded onto the bottom surface of the die, so that the die can be disposed on the carrier.

The carrier in the present embodiment may be a lead frame, and is not limited in the present embodiment.

In step 404, the die is plastic packaged by utilizing the plastic package body. The plastic package body is disposed on the carrier and coats a top surface and a plurality of side surfaces of the die to form the chip packaging structure.

In the present embodiment, it may grind the bottom surface of the interconnected die when performing grind on the bottom surface of the die.

In the present embodiment, the bottom surface of the die may be ground before the die attach film is disposed on the die, so that the total thickness of the ground die and the die attach film is equal to the first preset value; therefore, the total thickness of the chip packaging structure is constant, and the influence of the increased total thickness of the chip packaging structure on the design or manufacturing of an electronic device using the chip packaging structure can be avoided. Moreover, by limiting an upper limit value of the thickness of the die attach film, not only can the strength of the chip be ensured, but also the production difficulty can be reduced, and the packaging yield can be increased.

Since the second embodiment corresponds to the present embodiment, the present embodiment can be implemented cooperatively with the second embodiment. The relevant technical details mentioned in the second embodiment are still valid in the present embodiment, and the technical effect of the present embodiment can also be implemented in a same way, and in order to reduce the duplication, the details are not described herein. Correspondingly, the relevant technical details mentioned in the present embodiment may also be applied to the second embodiment.

Figure 5:
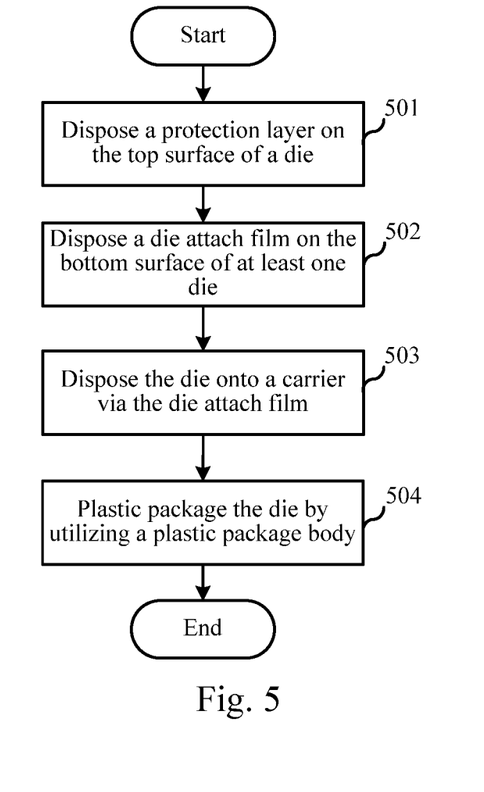
FIG. 5 is a flow chart illustrating a chip packaging method according to an eighth embodiment of the present disclosure.

An eighth embodiment of the present disclosure relates to a chip packaging method. The eighth embodiment is improved on the basis of the sixth embodiment. The improvement lies in that: in the present embodiment, a protection layer may be disposed on a top surface of the die before the die attach film is disposed on the bottom surface of the die, and the process of the chip packaging method of the present embodiment is as shown in FIG. 5, which is specifically as follows:

In step 501, the top surface of the die is provided with the protection layer. Specifically, the protection layer can be disposed on the top surface of the die by a spray coating method or a spin coating method; the protection layer may be of a polyimide material, so that the die can be well protected and can better resist the external impact damage, thereby improving the overall strength.

In step 502, the die attach film is disposed on the bottom surface of at least one die. Specifically, in the present embodiment, the thickness of the die attach film is greater than or equal to 40 micrometers, and two surfaces of the die attach film are respectively provided with adhesive.

In step 503, the die is disposed on the carrier via the die attach film. Specifically, one surface of the die attach film is bonded onto the carrier, and the other surface is bonded onto the bottom surface of the die, so that the die can be disposed on the carrier.

In step 504, the die is plastic packaged by utilizing the plastic package body. The plastic package body is disposed on the carrier, and coats the top surface and a plurality of side surfaces of the die to form the chip packaging structure. Specifically, in the present embodiment, the total thickness of the portion of the plastic package body covering the protection layer and the protection layer is equal to a second preset value. The second preset value may be set according to the actual requirement. For example, the second preset value may be a height value of the portion of the plastic package body corresponding to the top surface of the die in the chip packaging structure of the existing art. Preferably, the thickness of the protection layer may be greater than or equal to 1 micrometer, and less than or equal to 20 micrometers. In this case, if the thickness of the protection layer is relative large, the thickness of the plastic package body above the protection layer can be appropriately reduced, so that a sum of the thickness of the protection layer and the thickness of the plastic package body above the protection layer is equal to the second preset value, i.e. the sum of the thickness of the protection layer and the thickness of the plastic package body above the protection layer may be constant, and the performance of the chip is not influenced.

It shall be noted that the present embodiment may also be improved on the basis of the sixth embodiment, i.e. in the present embodiment, the top surface of the ground die may also be provided with the protection layer.

In the present embodiment, the die can be well protected by the protection layer and can better resist the external impact damage, thereby improving the overall strength. By limiting the total thickness of the portion of the plastic package body covering the protection layer and the protection layer, a total height of the protection layer and the plastic package body above the protection layer is constant, so that the performance of the chip is not influenced, and the total packaging thickness is constant.

The present embodiment is a method embodiment corresponding to the third embodiment, and the present embodiment can be implemented cooperatively with the third embodiment. The relevant technical details mentioned in the third embodiment are still valid in the present embodiment, and in order to reduce duplication, the details are not described herein. Correspondingly, the relevant technical details mentioned in the present embodiment may also be applied to the third embodiment.

Figure 6:
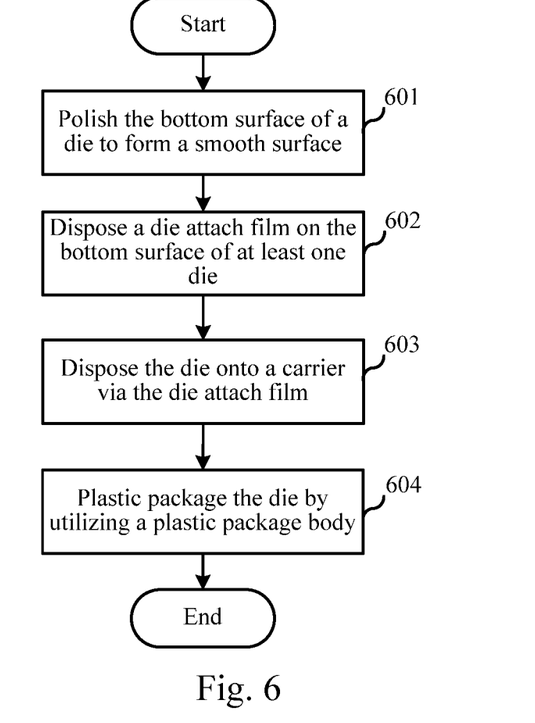
FIG. 6 is a flow chart illustrating a chip packaging method according to a ninth embodiment of the present disclosure.

A ninth embodiment of the present disclosure relates to a chip packaging method. The ninth embodiment is improved on the basis of the sixth embodiment. The improvement lies in that: in the present embodiment, the bottom surface of the die is polished to form the smooth surface before the die attach film is disposed on the bottom surface of the die, and the process of the chip packaging method of the present embodiment is as shown in FIG. 6, which is specifically as follows:

In step 601, the bottom surface of the die is polished to form the smooth surface.

In step 602, the die attach film is disposed on the bottom surface of at least one die. Specifically, the thickness of the die attach film in the present embodiment is greater than or equal to 40 micrometers, and two surfaces of the die attach film are respectively provided with adhesive.

In step 603, the die is disposed on the carrier via the die attach film. Specifically, one surface of the die attach film may be bonded onto the carrier, the other surface is bonded onto the bottom surface of the die. The smooth surface of the die faces the die attach film, so that the die can be disposed on the carrier.

In step 604, the die is plastic packaged by utilizing the plastic package body. The plastic package body is disposed on the carrier and coats the top surface and a plurality of side surfaces of the die to form the chip packaging structure.

It shall be noted that the present embodiment may also be improved on the basis of the seventh embodiment, i.e. in the present embodiment, the bottom surface of the ground die may also be polished to form the smooth surface. Of course, the present embodiment can also be improved on the basis of the eighth embodiment, i.e. in the present embodiment, the bottom surface of the die may also be polished to form the smooth surface after the protection layer is disposed on the top surface of the die.

In the present embodiment, the bottom of the die may be polished, so that the bottom surface of the die is the smooth surface, the scratches can be effectively decreased, i.e. the crack sources can be decreased (cracks are likely to occur at the scratches when the die is under the external pressure), thereby improving the strength of the die.

The present embodiment is a method embodiment corresponding to the fourth embodiment, and the present embodiment can be implemented cooperatively with the fourth embodiment. The relevant technical details mentioned in the fourth embodiment are still valid in the present embodiment, and in order to reduce duplication, the details are not described herein. Correspondingly, the relevant technical details mentioned in the present embodiment can also be applied to the fourth embodiment.

Those skilled in the art may understand that all or partial steps in the method of the above embodiments can be completed by adopting a program to instruct relevant hardware, and the program is stored in a storage medium and includes a plurality of instructions enabling one device (may be a single chip microcomputer, a chip and the like) or a processor to execute all or partial steps of the method in each embodiment of the present application. The forgoing storage medium includes various mediums capable of storing a program code such as a USB flash disk, a mobile hard disk, a read-only memory (ROM), a random access memory (RAM), a diskette or a compact disk and the like.

The ordinary skilled in the prior art can understand that the foregoing embodiments are specific embodiments for implementing the present disclosure, but in the actual application, various changes can be made on the aspects of forms and details without departing from the spirit and scope of the present disclosure.

What is claimed is:

1. A chip packaging structure, comprising: a die, a carrier, a die attach film, and a plastic package body, wherein:
   the die attach film is disposed on a bottom surface of the die, and a thickness of the die attach film is greater than or equal to 40 micrometers;
   the die is disposed on the carrier via the die attach film; and
   the plastic package body is disposed on the carrier body and coats a top surface and a plurality of side surfaces of the die;
   wherein a total thickness of the die and the die attach film is equal to a first preset value; wherein the first preset value is a constant value, and a thickness of the die correspondingly decreases when the thickness of the die attach film is relatively large.

2. The chip packaging structure according to claim 1, wherein the thickness of the die attach film is less than or equal to 150 micrometers.

3. The chip packaging structure according to claim 1, wherein the chip packaging structure further comprises a protection layer; and
   the protection layer is disposed on the top surface of the die and further coated by the plastic package body.

4. The chip packaging structure according to claim 3, wherein a total thickness of a portion of the plastic package body covering the protection layer and the protection layer is equal to a second preset value.

5. The chip packaging structure according to claim 3, wherein a thickness of the protection layer is greater than or equal to 1 micrometer, and less than or equal to 20 micrometers.

6. The chip packaging structure according to claim 3, wherein the protection layer is of a polyimide material.

7. The chip packaging structure according to claim 1, wherein the bottom surface of the die is a smooth surface.

8. The chip packaging structure according to claim 1, wherein a modulus of the die attach film is greater than 4 MPa.

9. The chip packaging structure according to claim 1, wherein the carrier is a substrate, and a modulus of the substrate is greater than 20 GPa.

10. A chip packaging method, comprising:
    disposing a die attach film on a bottom surface of a die, wherein a thickness of the die attach film is greater than or equal to 40 micrometers;
    disposing the die on a carrier via the die attach film; and
    plastic packaging the die by utilizing a plastic package body, wherein the plastic package body is disposed on the carrier and coats a top surface and a plurality of side surfaces of the die to form a chip packaging structure;
    wherein before the die attach film is disposed on the bottom surface of at least one die, and the chip packaging method further comprises:
    grinding the bottom surface of the die; wherein, a total thickness of the ground die and the die attach film is equal to a first preset value.

11. The chip packaging method according to claim 10, wherein the thickness of the die attach film is less than or equal to 150 micrometers.

12. The chip packaging method according to claim 10, wherein before the die attach film is disposed on the bottom surface of at least one die, the chip packaging method further comprises:
    polishing the bottom surface of the die to form a smooth surface, wherein the smooth surface faces the die attach film.

13. The chip packaging method according to claim 10, wherein before the die attach film is disposed on the bottom surface of at least one die, the chip packaging method further comprises:
    disposing a protection layer on the top surface of the die.

14. The chip packaging structure according to claim 13, wherein a total thickness of a portion of the plastic package body covering the protection layer and the protection layer is equal to a second preset value.

15. The chip packaging method according to claim 13, wherein the protection layer is disposed on the top surface of the die by a spray coating method or a spin coating method.

16. The chip packaging method according to claim 13, wherein the protection layer is of a polyimide material.

17. The chip packaging method according to claim 10, wherein a modulus of the die attach film is greater than 4 MPa.

18. The chip packaging method according to claim 10, wherein the carrier is a substrate, and a modulus of the substrate is greater than 20 GPa.

* * * * *